US011721919B2

(12) United States Patent
Parigot et al.

(10) Patent No.: US 11,721,919 B2
(45) Date of Patent: Aug. 8, 2023

(54) ELECTRICAL ASSEMBLY

(71) Applicant: Valeo Siemens eAutomotive France SAS, Cergy (FR)

(72) Inventors: Baptiste Parigot, Croissy-sur-Seine (FR); Alwin Moceri, Conflans Sainte-Honorine (FR)

(73) Assignee: VALEO SIEMENS EAUTOMOTIVE FRANCE SAS, Cergy (FR)

( * ) Notice: Subject to any disclaimer, the term of this patent is extended or adjusted under 35 U.S.C. 154(b) by 875 days.

(21) Appl. No.: 16/538,461

(22) Filed: Aug. 12, 2019

(65) Prior Publication Data

US 2020/0052422 A1    Feb. 13, 2020

(30) Foreign Application Priority Data

Aug. 13, 2018   (FR) ...................................... 1857466

(51) Int. Cl.
| | |
|---|---|
| *B60R 16/00* | (2006.01) |
| *H01R 12/58* | (2011.01) |
| *H02K 11/33* | (2016.01) |
| *B60R 16/02* | (2006.01) |
| *H01R 9/16* | (2006.01) |
| *H01R 9/22* | (2006.01) |
| *H02G 5/02* | (2006.01) |
| *H05K 7/02* | (2006.01) |
| *H05K 7/14* | (2006.01) |

(52) U.S. Cl.
CPC ............. *H01R 12/58* (2013.01); *B60R 16/02* (2013.01); *H01R 9/16* (2013.01); *H01R 9/223* (2013.01); *H02G 5/025* (2013.01); *H02K 11/33* (2016.01); *H05K 7/026* (2013.01); *H05K 7/1427* (2013.01); *H01R 2201/26* (2013.01)

(58) Field of Classification Search
CPC ....... H01M 2/202; B23K 26/22; H01G 11/10; H02G 5/00; H02G 11/10; H02G 11/74; B60R 16/02
See application file for complete search history.

(56) References Cited

U.S. PATENT DOCUMENTS

| | | |
|---|---|---|
| 5,263,247 A | 11/1993 | Adachi et al. |
| 8,324,723 B2 | 12/2012 | Lin et al. |
| 8,393,765 B2 | 3/2013 | Sugishita et al. |

(Continued)

FOREIGN PATENT DOCUMENTS

| | | |
|---|---|---|
| EP | 0590643 A2 | 4/1994 |
| EP | 1376839 A1 | 1/2004 |

(Continued)

OTHER PUBLICATIONS

Search Report from French Intellectual Property Office on co-pending FR application (FR1857466) dated Apr. 29, 2019.

*Primary Examiner* — Phuong Chi Thi Nguyen

(74) *Attorney, Agent, or Firm* — KOS IP Law LLP

(57) ABSTRACT

The invention has for object an electrical assembly comprising:
 a first electrical connection bar,
 a second electrical connection bar, and
 an electronic card,
the first and the second electrical connection bar being in electrical contact with one another, on a connection zone, said card being at a distance from said connection zone. The assembly further comprises an electrical conduction part that creates an electrical connection between said connection zone and the electronic card.

19 Claims, 2 Drawing Sheets

(56) References Cited

U.S. PATENT DOCUMENTS

| | | | |
|---|---|---|---|
| 8,525,214 B2 | 9/2013 | Lin et al. | |
| 8,734,185 B2 * | 5/2014 | Gailus | H01R 13/665 439/620.21 |
| 8,865,525 B2 | 10/2014 | Lin et al. | |
| 2013/0306999 A1 * | 11/2013 | Sakaguchi | H01L 27/15 257/89 |

FOREIGN PATENT DOCUMENTS

| | | |
|---|---|---|
| EP | 3240157 A1 | 11/2017 |
| JP | 6302932 A | 10/1994 |
| JP | 4091938 B2 | 5/2008 |
| JP | 2013-235757 A | 11/2013 |
| JP | 5578449 B2 | 8/2014 |

* cited by examiner

ELECTRICAL ASSEMBLY

TECHNICAL FIELD

The present invention relates to the field of electrical equipment, in particular for electric or hybrid vehicles and relates more particularly to an electrical assembly comprising at least one electrical conduction part in order to connect an electronic card.

The invention aims in particular to carry an electrical energy on an electronic card from an electrical connection bar.

BACKGROUND

As is known, an electric or hybrid motor vehicle comprises an electrical motorisation system powered by a high-voltage power supply battery via an on-board high-voltage electrical network and a plurality of auxiliary electrical equipment powered by a low-voltage power supply battery via an on-board low-voltage electrical network.

The high-voltage power supply battery provides a function of supplying with energy of the electrical motorisation system allowing for the propulsion of the vehicle. More precisely, in order to control the electric motor driving the wheels of the vehicle, it is known to use an inverter that makes it possible to convert the DC current supplied by the high-voltage power supply battery into one or several AC control currents, for example sinusoidal. In a piece of electrical equipment such as an inverter, in order to simplify the manufacture thereof with respect to the conformation and to the bulkiness of the components, it can be preferable to use several electrical connection bars connected together in order to carry the current from one point to another, rather than a single electrical conduction bar. Typically, a first electrical connection bar is connected by a first end to a connector connected to the high-voltage power supply battery, and to a second electrical connection bar by a second end. The second electrical connection bar carries the current to an electrical component of the equipment. In order to filter the current delivered by the battery, the electrical equipment comprises an electronic card that carries out the filtering of the current. It is necessary to power the electronic card so that it implements its filtering function.

For example, as shown in FIG. 1, it is known to power the electronic card 10 by connecting it directly to the second electrical connection bar 12 via a pin 13 coming from the second electrical connection bar 12. The first electrical connection bar 11 is connected to another point of the second electrical connection bar 12 by a screw 14. A connection must therefore be provided of the first 11 and of the second 12 electrical connection bars and another connection between the electronic card 10 and the second electrical connection bar 11. Furthermore, deformations of the second electrical connection bar 12 with respect to the electronic card 10 can generate forces on the card 10, and even damage the pin 13, which can penalise the electrical power supply of the electronic card 10.

A means for creating the electrical connection of an electronic card in a simple and safe way for the electronic card is therefore sought.

SUMMARY

To this effect, the invention relates to an electrical assembly comprising:
a first electrical connection bar,
a second electrical connection bar, and
an electronic card,
the first and the second electrical connection bar being in electrical contact with one another, on a connection zone, said electronic card being at a distance from said connection zone. The electrical assembly further comprises an electrical conduction part that creates an electrical connection between said connection zone and the electronic card.

Thanks to the electrical conduction part, the electrical contact with the electronic card is carried out using the connection zone between the first and the second electrical connection bar. Thus, it is not necessary to provide another connection point on the second electrical connection bar to carry a current to the electronic card from the second electrical connection bar. Furthermore, the electrical conduction part makes it possible to limit the forces transmitted to the electronic card in case of deformations of the first or of the second electrical connection bar in relation to the card.

According to an embodiment, the first electrical connection bar, the second electrical connection bar, and the electrical conduction part are superimposed and in contact.

According to an embodiment, the electrical conduction part is between the first connection bar and the second electrical connection bar.

According to an embodiment, the first and the second electrical connection bars respectively comprise, in the connection zone, a first opening and a second opening configured to receive a fastening member in such a way as to maintain together the first and the second electrical connection bars for an electrical contact; and the electrical conduction part delimits an opening configured to receive said fastening member in such a way as to maintain the electrical conduction part with the electrical connection bars for an electrical contact.

According to an embodiment, the electrical conduction part comprises a flat portion coming into contact with the first or the second electrical connection bar, and at least one electrical pin connection extending from an edge of the flat portion and comprising a connection end connected to the flat portion, at least one intermediate portion and at least one free end connected to said connection end by said at least one intermediate portion, said at least one free end being adapted to be electrically connected to the electronic card.

According to an embodiment, the electrical conduction part is of a single piece.

According to an embodiment, said electrical conduction part further comprises bearing portions bearing on a support.

According to an alternative, the support is formed by the electronic card.

According to an embodiment, the electronic card comprises a through-opening or a protrusion through which pass the first electrical connection bar or the second electrical connection bar, the connection zone being in the through-opening or the protrusion, or facing the through-opening or the protrusion in particular along a direction perpendicular to the plane of the electronic card.

According to an embodiment, the first electrical connection bar is configured to be connected to an electrical power supply connector, the second electrical connection bar is configured to carry an electrical energy received from the first connection bar to an electrical component, the electronic card comprising components configured to control a filtering of the energy delivered by the second connection bar.

BRIEF DESCRIPTION OF THE DRAWINGS

The invention shall be better understood when reading the following description, provided solely by way of example, and in reference to the accompanying drawings given by way of non-limiting examples, wherein.

Note that the figures disclose the invention in a detailed manner to implement the invention, said figures able of course to be used to better define the invention where applicable.

DETAILED DESCRIPTION

Figure 1:
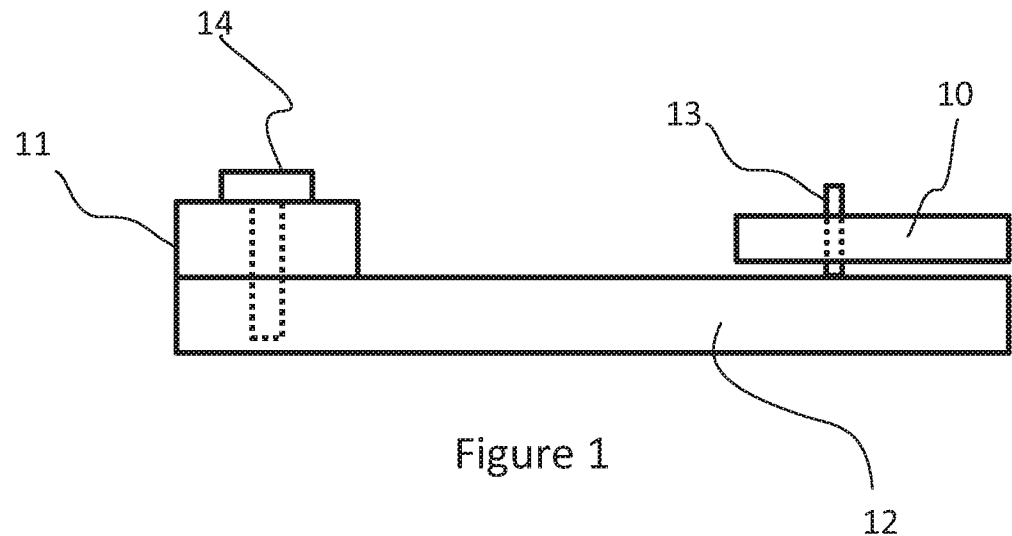
FIG. 1, already described, is a side view of an electrical assembly according to prior art.
Figure 2:
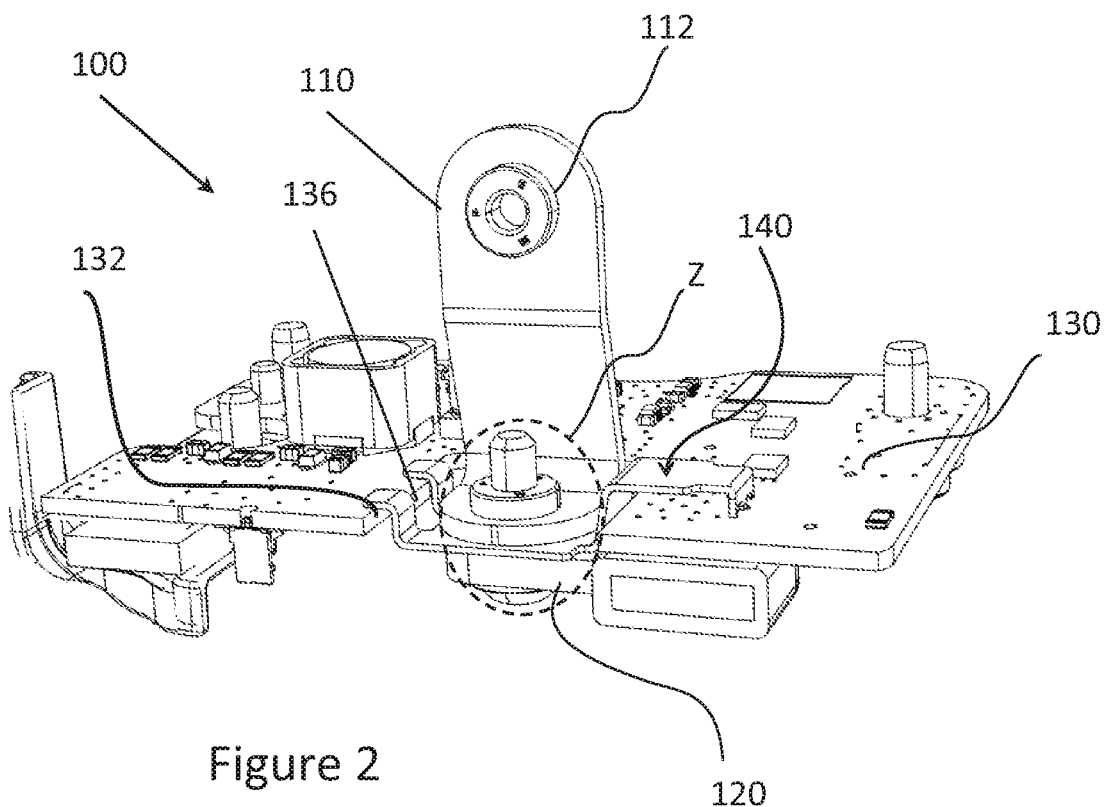
FIG. 2 is a perspective view of an example of an electrical assembly according to the invention.

FIG. 2 shows a cross-section view in perspective of an example of an electrical assembly 100 according to the invention. The assembly 100 comprises a first electrical connection bar 110 and a second electrical connection bar 120 and an electronic card 130. The first 110 and the second 120 electrical connection bars are in electrical contact with one another, on a connection zone Z.

In particular, each electrical connection bar 110, 120 comprises at least one electrically conductive bar, in particular metal, which comprises a first and a second ends configured to each be connected to an electrical component. For example, each electrical connection bar 110, 120 creates an electrical connection between a first electrical component of the assembly 100 and a second electrical component of the assembly 100. Thus, in a particular example, in the connection zone Z, the first electrical connection bar 110 comprises an end that connects to an end of the second connection bar 120 in order in particular to circulate a current from the first 110 to the second 120 electrical connection bar. More particularly, a second end 112 of the first electrical connection bar 110 can be connected to an external electrical connector of the electrical assembly 100, and the second end of the second electrical connection bar 120 can be connected to a capacitor of the electrical assembly 100.

The electronic card 130 is at a distance from the connection zone Z. In other words, the electronic card 130 does not come directly into contact with the portions of the electrical connection bars 110, 120 that create an electrical contact between the first 110 and the second 120 electrical connection bar. However, the electronic card 130 is electrically connected to the connection zone Z by an electrical conduction part 140. Thus, with a single electrical connection zone Z, an electrical contact is obtained between the electronic card 130, the first 110 and the second 120 electrical connection bars. Thanks to the electrical conduction part 140, the electrical contact with the electronic card 130 is carried out using the connection zone Z between the first 110 and the second 120 electrical connection bars. This makes it possible to create the electrical connection in a single operation. Furthermore, the electrical conduction part 140 makes it possible to limit a transmission of forces due to the deformations of electrical conduction bars 110, 120 to the electronic card 130. Thus, damage to the electronic card 130 is avoided.

In particular, the first electrical connection bar 110, the second electrical connection bar 120, and the electrical conduction part 140 can be superimposed and in contact, in such a way as to provide an electrical connection between the three elements 110, 120, 140. The first electrical connection bar 110, the second electrical connection bar 120, and the electrical conduction part 140 can therefore be stacked on one another, for example as shown in the figures.

Figure 3:
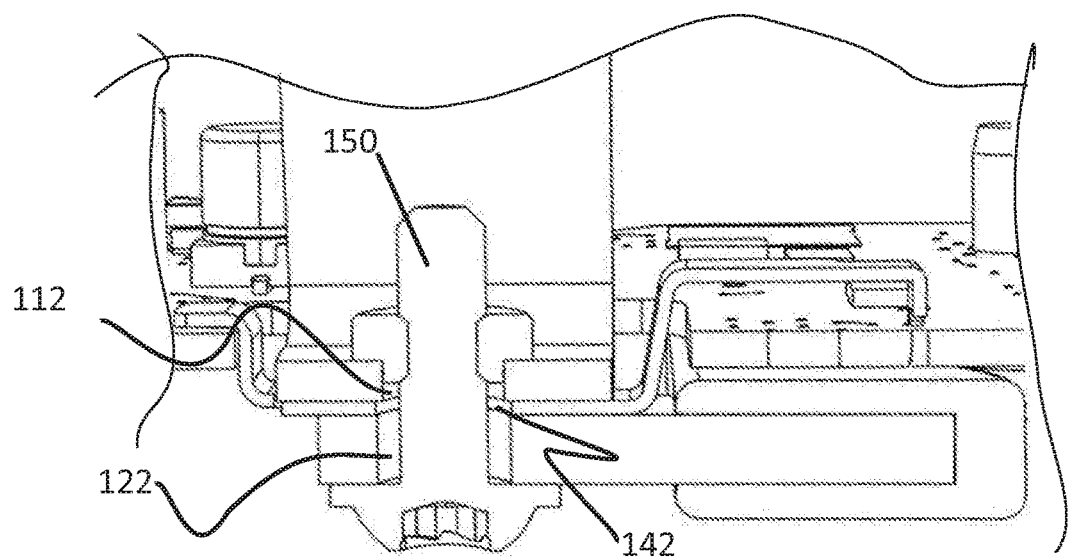
FIG. 3 is a cross-section view of the assembly of FIG. 2.

In particular, in reference to FIG. 3 which shows an enlarged cross-section view of the assembly of FIG. 2, the first electrical connection bar 110 can comprise a first opening 112 and the second electrical connection bar 120 can comprise a second opening 122. The conduction part 140 comprises a third opening 142. A fastening member 150, such as a screw, is introduced into these openings 112, 122, 142 in such a way as to create an electrical contact by maintaining together the first 110 and the second 120 electrical connection bars and the electrical conduction part 140. Alternatively, the electrical connection bars 110, 120 and the electrical conduction part 140 can be connected by welding, by brazing or by any other means making it possible to maintain together portions of the electrical conduction bars 110, 120 and of the electrical conduction part 140 in order to create an electrical connection between the three elements 110, 120, 140.

Figure 4:
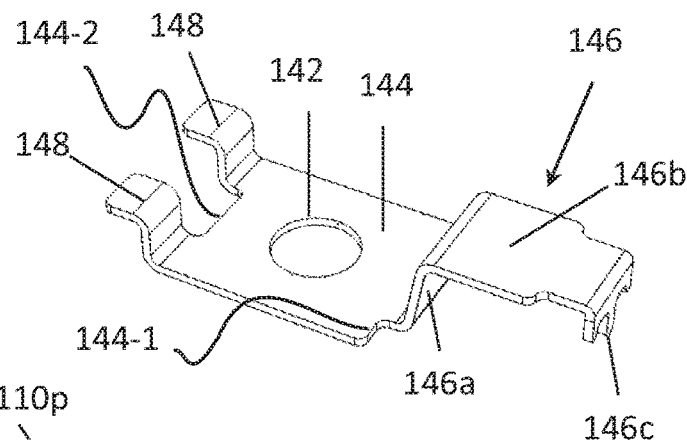
FIG. 4 shows an example of an electrical conduction part included in the electrical assembly of FIG. 1.
Figure 5:
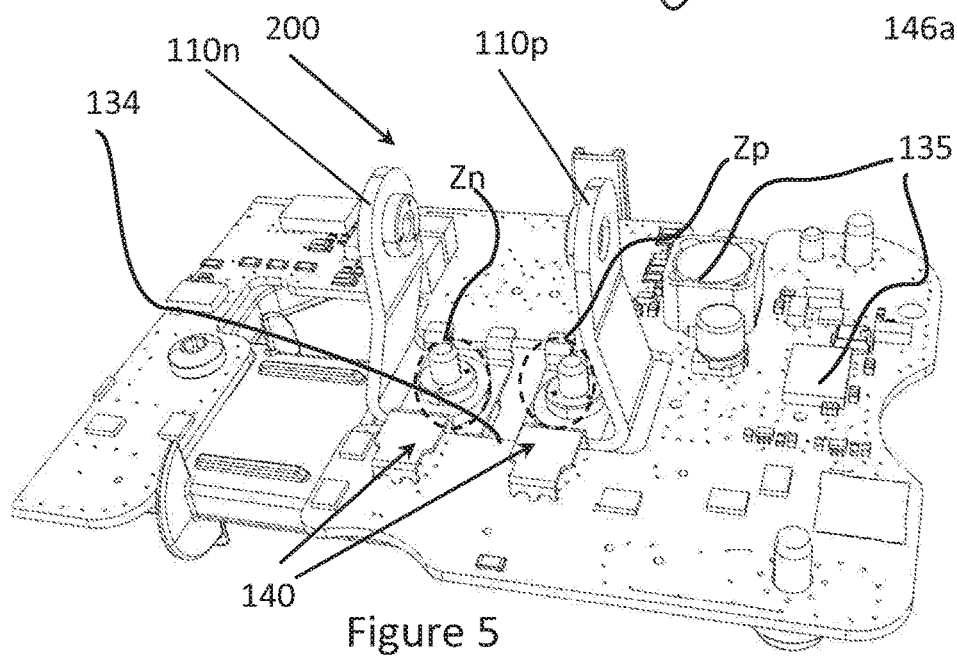
FIG. 5 shows another example of an electrical assembly according to the invention.

As shown in FIG. 4, the electrical conduction part 140 can include a flat portion 144 that comes into contact with the first electrical connection bar 110 or the second electrical connection bar 120. In the examples shown in FIGS. 2, 3 and 5, a face of the flat portion 144 comes against a flat portion of the first electrical connection bar 110 and an opposite face of the flat portion 144 comes against a flat portion of the second electrical connection bar 120. However, said flat portion 144 of the electrical conduction part 140 could be located at an end of the stack. In particular, the flat portion 144 can comprise the third opening 142 of the electrical conduction part 140. The flat portion 144 can be substantially rectangular, for example as shown in the figures.

An electrical pin connection 146 extends from an edge 144-1 of the flat portion 144, called "front edge" in reference to FIG. 4. Said broche 146 comprises a connection end 146a connected to the flat portion 144 on said front edge 144-1, an intermediate portion 146b and a free end 146c. Note that the electrical pin connection 146 could include more than one free end 146c. The broche 146 makes it possible to connect the electronic card 130 to the flat portion 144 and therefore to the connection zone Z. The shape of the electrical pin connection 146 makes it possible to offset the free end 146c of the pin 146 from the flat portion 144 in such a way that it extends at a distance from the flat portion 144. In other terms, the intermediate portion 146b makes it possible to cross a distance between the flat portion 144 and the electronic card 130 so as in particular to position the free end 146c in line with the track or with the electrical connection terminal of the electronic card 130 on which it is connected.

The electronic card 130 can include a through-opening 132, wherein passes the first electrical connection bar 110 in order to coma against the second electrical connection bar 120. The connection zone Z is then located in the through-opening 132, or facing the through-opening 132 along a direction perpendicular to the plane of the electronic card 130. This is in particular the case when the electronic card 130 is between the first 110 and the second 120 electrical connection bars in order to improve the integration thereof into the electrical assembly 100.

The connection end 146a, the intermediate portion 146b and the free end 146c of the electrical conduction part 140 then make it possible to exit from the opening 132 of the electronic card 130 wherein the contact zone Z is located. For example, the connection end 146a extends mainly in a plane that is transversal in relation to the flat portion 144.

The intermediate portion 146b extends mainly in a plane parallel to the flat portion 144. The intermediate portion 146b is partially curved in order to connect the connection end 146a and the free end 146c. The free end 146c extends orthogonally to the flat portion 144. In particular, the free end 146c can have a shape that is suited for being housed in an orifice of the electronic card 130 in order to we welded thereto. Alternatively, the end of the free end 146c could be configured to be positioned on the surface of the electronic card 130 in order to be connected thereto.

The flat portion 144 and the pin 146 make it possible in particular to improve the integration of the components in a case of the electrical assembly 100 and to provide both flexibility during the mounting of the electrical conduction part 140 with the electronic card 130, and good electrical contact between the free end 146c and its electrical connection point on the electronic card 130.

The electronic card 130 can facilitate the mounting of the electrical conduction part 140 by being used as a support for the electrical conduction part 140 during the mounting thereof in the conduction zone Z. To this effect, the electrical conduction part 140 can comprise two curved retaining lugs 148 and extending from the rear edge 144-2, opposite the front edge 144-1 of the flat portion 144. The retaining lugs 148 bear against an edge of the opening 132 of the electronic card 130 in order to facilitate the positioning of the electrical conduction part 140. Thus, using an additional support for the electrical conduction part 140 is avoided. Alternatively, such a support, different from the electronic card 130, can be used.

The electronic card 130, or the additional support where applicable, can comprise a locking tab 136 extending from the edge of the opening 132 of the electronic card 130 in order to come between the two retaining lugs 148 in order to allow for the blocking in rotation of the electrical conduction part 140.

For example, the electrical pin connection 146, and the retaining lugs 148 come from the material of the flat portion 144, i.e. the part 140 is made from a single piece. They can advantageously be formed by conforming them using the same material, in particular from a single sheet. Thus, the electrical conduction part 140 can be formed from a sheet of electrically conductive material, for example a metal, which is cut and stamped. The electrical conduction part 140 is for example made of metal and can be made of copper, steel, aluminium or any other conductive material. The electrical conduction part 140 can advantageously be covered with an anti-wear surface, for example comprised of tin and nickel. Advantageously, the thickness of the electrical conduction part 140, in particular of the flat portion 144, is less than 1.5 mm, preferably about 1 mm, so as in particular to make it easy to form the electrical pin connection 146 and retaining lugs 148 during the manufacture of the electrical conduction part 140.

The electrical assembly according to the invention can comprise a plurality of electrical connection zones Z each with a first and a second electrical connection bar and a respective electrical conduction part. For example in FIG. 5, the example of the electrical assembly 200 comprises a first connection zone Zn having a negative polarity and a second connection zone Zp having a positive polarity. These electrical connection zones Zn, Zp are connected to the electronic card 130 by the intermediary of a respective electrical conduction part 140. Furthermore, the assembly 200 comprises a protrusion 134 instead of an opening made in the electronic card 130. However, the electronic card 130 of the assembly 200 could comprise a through-opening of which the edges are integrally formed by the material of the electronic card 130.

In particular, in this example, the first electrical connection bars 110n, 110p can be configured to be connected to an electrical connector of the electrical assembly 200. Such an electrical connector carries for example an electrical energy delivered by a battery to the electrical assembly 200. The second connection bars located under the electronic card 130 in FIG. 5, can be configured to carry the electrical energy received from the first connection bars 110n, 110p to an electrical component of the electrical assembly 200. Such an electrical component can be a smoothing capacitor of the electrical assembly 200. The electronic card 130 can be configured to carry out a filtering of the energy delivered by the second electrical connection bar 120, and comprise components 135 for this purpose. The electrical assembly 200 is moreover similar to the assembly 100 shown in the other figures.

The electrical assembly 200 forms for example an inverter configured to power an electrical machine driving a vehicle. Alternatively the electrical assembly 200 can be an electrical charger configured to be carried aboard a vehicle in order to charge a battery of the vehicle from an electrical network, for example an electrical network outside the vehicle. The electrical assembly 200 could also be a DC-DC converter configured to convert a voltage between a high-voltage battery of a vehicle and a low-voltage battery of the vehicle.

The invention is not limited to only the examples described hereinabove. The figures show particular embodiments that combines several embodiments.

The invention claimed is:

1. An electrical assembly comprising:
    a first electrical connection bar;
    a second electrical connection bar; and
    an electronic card;
    wherein the first electrical connection bar and the second electrical connection bar being in electrical contact with one another, on a connection zone, and said electronic card being at a distance from said connection zone;
    wherein said electrical assembly further comprising an electrical conduction part that creates an electrical connection between said first electrical connection bar and said second electrical connection bar, on the connection zone, and the electronic card;
    wherein the electrical conduction part comprises:
        a flat portion in contact with the first or the second electrical connection bar; and
        at least one electrical pin connection extending from an edge of the flat portion and comprising a connection end connected to the flat portion, at least one intermediate portion and a free end connected to said connection end through said at least one intermediate portion, said free end being electrically connected to the electronic card, and
    wherein the intermediate portion extends in a plane substantially parallel to the flat portion, and is partially curved to connect the connection end to the free end.

2. The electrical assembly according to claim 1, wherein the first electrical connection bar, the second electrical connection bar, and the electrical conduction part are superimposed and in contact.

3. The electrical assembly according to claim 1, wherein the electrical conduction part is between the first connection bar and the second electrical connection bar.

4. The electrical assembly according to claim 1, wherein each of the first and the second electrical connection bars respectively comprises, in the connection zone, a first opening and a second opening configured to receive a fastening member to maintain the first and the second electrical connection bars for an electrical contact; and
wherein the electrical conduction part comprises an opening configured to receive said fastening member to maintain the electrical conduction part with the electrical connection bars for an electrical contact.

5. The electrical assembly according to claim 1, wherein the electrical conduction part is of a single piece.

6. The electrical assembly according to claim 1, wherein the first electrical connection bar is configured to be connected to an electrical power supply connector, the second electrical connection bar is configured to carry an electrical energy received from the first connection bar to an electrical component, the electronic card comprising components configured to control a filtering of the energy delivered by the second connection bar.

7. The electrical assembly according to claim 1, wherein said electrical conduction part further comprises bearing portions bearing on a support.

8. The electrical assembly according to claim 7, wherein the support is formed by the electronic card.

9. An electrical assembly comprising:
a first electrical connection bar;
a second electrical connection bar; and
an electronic card;
wherein the first electrical connection bar and the second electrical connection bar being in electrical contact with one another, on a connection zone, and said electronic card being at a distance from said connection zone;
wherein said electrical assembly further comprising an electrical conduction part that creates an electrical connection between said first electrical connection bar and said second electrical connection bar, on the connection zone, and the electronic card, and
wherein the electronic card comprises a through-opening or a protrusion through which pass the first electrical connection bar or the second electrical connection bar, the connection zone being in the through-opening or the protrusion, or facing the through-opening or the protrusion in particular along a direction perpendicular to the plane of the electronic card.

10. An electrical assembly comprising:
a first electrical connection bar;
a second electrical connection bar; and
an electronic card;
wherein the first electrical connection bar and the second electrical connection bar being in electrical contact with one another, on a connection zone, and said electronic card being at a distance from said connection zone;
wherein said electrical assembly further comprising an electrical conduction part that creates an electrical connection between said first electrical connection bar and said second electrical connection bar, on the connection zone, and the electronic card;
wherein the first and the second electrical connection bars respectively comprise, in the connection zone, a first opening and a second opening configured to receive a fastening member in such a way as to maintain together the first and the second electrical connection bars for an electrical contact; and
wherein the electrical conduction part delimits an opening configured to receive said fastening member in such a way as to maintain the electrical conduction part with the electrical connection bars for an electrical contact.

11. The electrical assembly according to claim 10, wherein the first electrical connection bar, the second electrical connection bar, and the electrical conduction part are superimposed and in contact.

12. The electrical assembly according to claim 10, wherein the electrical conduction part is between the first connection bar and the second electrical connection bar.

13. The electrical assembly according to claim 10, wherein the electrical conduction part is of a single piece.

14. The electrical assembly according to claim 10, wherein said electrical conduction part further comprises bearing portions bearing on a support.

15. The electrical assembly according to claim 14, wherein the support is formed by the electronic card.

16. An electrical assembly comprising:
a first electrical connection bar;
a second electrical connection bar; and
an electronic card;
wherein the first electrical connection bar and the second electrical connection bar being in electrical contact with one another, on a connection zone, and said electronic card being at a distance from said connection zone;
wherein said electrical assembly further comprising an electrical conduction part that creates an electrical connection between said first electrical connection bar and said second electrical connection bar, on the connection zone, and the electronic card; and
wherein the electrical conduction part comprises:
a flat portion in contact with the first or the second electrical connection bar; and
at least one electrical pin connection extending from an edge of the flat portion and comprising a connection end connected to the flat portion, at least one intermediate portion and at least one free end connected to said connection end by said at least one intermediate portion, said at least one free end being adapted to be electrically connected to the electronic card.

17. The electrical assembly according to claim 16, wherein the first electrical connection bar, the second electrical connection bar, and the electrical conduction part are superimposed and in contact.

18. The electrical assembly according to claim 16, wherein the electrical conduction part is between the first connection bar and the second electrical connection bar.

19. The electrical assembly according to claim 16, wherein the electrical conduction part is of a single piece.

* * * * *